US007678659B2

United States Patent
Tu et al.

(10) Patent No.: US 7,678,659 B2
(45) Date of Patent: Mar. 16, 2010

(54) METHOD OF REDUCING CURRENT LEAKAGE IN A METAL INSULATOR METAL SEMICONDUCTOR CAPACITOR AND SEMICONDUCTOR CAPACITOR THEREOF

(75) Inventors: Chao-Chun Tu, Hsin-Chu (TW);
Ming-Chieh Lin, Hsin-Chu Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 132 days.

(21) Appl. No.: 11/421,771

(22) Filed: Jun. 2, 2006

(65) Prior Publication Data

US 2007/0072361 A1    Mar. 29, 2007

Related U.S. Application Data

(60) Provisional application No. 60/596,463, filed on Sep. 26, 2005.

(51) Int. Cl.
*H01L 21/00* (2006.01)
(52) U.S. Cl. ............... 438/387; 438/393; 438/396; 438/618; 438/622; 257/E21.008; 257/E21.011; 257/E21.301; 257/E21.524; 257/E21.579
(58) Field of Classification Search ............ 438/396, 438/381, 303, 307, 296, 250, 253, 257, 387, 438/393, 618–622; 361/301.4; 257/E21.008, 257/E21.011, E21.268, E21.304, E21.524, 257/E21.579, E21.614
See application file for complete search history.

(56) References Cited

U.S. PATENT DOCUMENTS 6,198,617 B1 * 3/2001 Sun .................. 361/301.4
6,451,667 B1    9/2002 Ning
6,459,562 B1 * 10/2002 KarRoy et al. ........... 361/312
6,504,202 B1 *  1/2003 Allman et al. ........... 257/303
6,617,914 B1    9/2003 Kothandaraman
6,620,701 B2    9/2003 Ning
6,638,830 B1   10/2003 Tsai
6,693,017 B1    2/2004 Fayaz et al.
6,709,918 B1 *  3/2004 Ng et al. ................. 438/253
6,723,600 B2    4/2004 Wong
6,780,775 B2    8/2004 Ning
6,890,816 B2    5/2005 Liang
7,118,925 B2 * 10/2006 Brennan et al. ............. 438/3
7,170,090 B1 *  1/2007 Chaparala et al. ......... 257/48
7,294,544 B1 * 11/2007 Ho et al. ................. 438/250
2004/0087098 A1 *  5/2004 Ng et al. ................. 438/381
2006/0134862 A1 *  6/2006 Parris et al. .............. 438/257
2007/0065966 A1 *  3/2007 Chinthakindi et al. ...... 438/50

* cited by examiner

*Primary Examiner*—Michael S Lebentritt
(74) *Attorney, Agent, or Firm*—Winston Hsu

(57) ABSTRACT

A method for reducing leakage current in a semiconductor capacitor. The method includes providing a top plate for collecting charge, providing a bottom plate for collecting an opposing charge to the top plate, providing a dielectric layer for insulation between the top plate and the bottom plate, providing a top contact, providing a bottom contact, providing a plurality of vias including top level vias for connecting the top plate to the top contact, and bottom level vias for connecting the bottom plate to the bottom contact; and separating a via and an adjacent structure such that their distance is greater than a minimum via spacing requirement of a foundry design rule for a semiconductor process producing the semiconductor capacitor.

30 Claims, 7 Drawing Sheets

METHOD OF REDUCING CURRENT LEAKAGE IN A METAL INSULATOR METAL SEMICONDUCTOR CAPACITOR AND SEMICONDUCTOR CAPACITOR THEREOF

CROSS REFERENCE TO RELATED APPLICATIONS

This application claims the benefit of U.S. Provisional Application No. 60/596,463, filed 2005/9/26, entitled "Method to avoid of MIMcap leakage" and included herein by reference.

BACKGROUND

The present invention relates to semiconductors, more specifically, to a method of reducing semiconductor MIM capacitor leakage through a reduced via density layout.

In semiconductor integrated circuits (ICs), a semiconductor capacitor may be implemented to provide a capacitive component within the design of a semiconductor integrated device. The applications for these capacitors can include mixed signal (analog/digital) devices, RF (radio frequency) devices, and even decoupling capacitors for the filtering of high frequency signals and improved noise immunization.

One type of semiconductor capacitor, is called the MIMcap (Metal-Insulator-Metal capacitor) and is commonly used in silicon based processes for its versatility and consistency in reproduction in semiconductor processing. FIG. 1 shows a MIMcap 100 of the related art. This type of thin film capacitor comprises of 3 parallel layers: a base metal plate layer 110, followed by a non-conductive dielectric layer 120, and finally a top metal plate layer 130. When integrated into a semiconductor circuit, this device is formed onto the substrate 140 base level.

Formation of a semiconductor capacitor typically entails the deposition, patterning, and etching of various layers and compounds onto a semiconductor substrate. Generally, the first parallel layer (base plate) is formed by deposition of a conductive layer over the substrate surface, which is usually silicon. Alternatively, the surface of the substrate may be highly doped in order to provide a conductive top layer forming the bottom plate of the capacitor. The resulting conductive surface would then be spun with photoresist, and etched to follow an appropriate pattern. Similarly, a non-conductive insulating layer is deposited and formed accordingly, and patterned such that the insulating layer covers at least a portion of the conductive bottom plate. Typical materials for the insulating dielectric layer include Silicon Oxide, and Silicon Nitride. Finally, a second conducting layer, or the top plate of the capacitor is formed in a similar manner and manages to complete the capacitor. Depending on the process and/or IC, the capacitor may be further subjected to another nonconductive deposition to isolate the capacitor, or for another parallel process of the IC.

In order to connect a semiconductor capacitor to other components on the IC, a conductive contact plate is needed. Referring to FIG. 2, contact plates are generally used to wire bond the capacitor to other components of the IC or to connect to different layers of the IC circuit while preventing direct contact and possible damage to the capacitor plates itself. A top contact 210 is used to connect to the capacitor top plate 220, while a bottom contact 250 is used to connect to the capacitor bottom plate 260. The top contact 210 and bottom contact 250 also possess large surfaces to aid in bonding and making necessary physical connections. The contact plates 210, 250 are deposited on top of the isolation layer 230, which covers and protects the internals of the capacitor. Connections from contact plates 210, 250 to the capacitor plates 220, 260 are made directly through multiple vias 240. Vias 240 are metallic based connectors that form between etched holes through the isolation layer 230 to allow for direct connection with the capacitor plates 220, 260.

The formation of the vias 240 are accomplished by spinning photoresist onto the isolation layer 230 which protects the capacitor, and exposing and developing the photoresist to result in a pattern of exposed holes. These exposed areas will be etched, a process that removes selected portions of the insulating layer right down to the capacitor plates 220. In the case of MIM capacitors, the etching process is typically a plasma based process. Once the surface of the capacitor plates 220 is reached by etching, the vias 240 can be deposited, typically through chemical vapor deposition (CVD), from which the metal contact layer 210 can now be placed in contact with the vias 240.

In order to maximize current flow between the capacitor plates 220, 260 and the contact plates 210, 250 manufacturers typically maximize the number of vias 240 between the capacitor plates 220, 260 and the contact plates 210, 250 according to the available surface area on the semiconductor and the foundry design guidelines for a semiconductor process. The greater the number of vias 240, the lower the resistance path is between the capacitor plates 220, 260 and contact plates 210, 250. Therefore, it is advantageous to always maximize the number of allowable vias 240.

A precise process method for via formation is required, otherwise defects in the MIMcap may result. If via holes are overetched, portions of the top capacitor plate 220 will be removed. This will result in a damaged top capacitor plate 220 and possibly cause charge leakage through the dielectric. In the case of plasma etching, charge carriers may in fact be diffused through the top capacitor plate into the dielectric while etching, resulting in current leakage. In essence, charge leakage will deter a capacitors ability to store charge and reduce its overall capacitance value. In circuits where the predictable behavior and values of capacitors are crucial, this is an important consideration.

Etch depths are also experimentally found to increase with Via density. That is for a given process, if the number of via holes are increased during etching, the etch depth for each via hole is also found to increase. This may result in overetching, and excess removal of the capacitor top plate beyond recommendation.

To prevent excess capacitor leakage current and charge loss, it is desirable to not overetch vias during MIMcap fabrication in order to ensure a reliable MIMcap with predictable operational capacitance.

SUMMARY OF THE INVENTION

An objective of the present invention is therefore to reduce MIM capacitor leakage current caused as a result of charge diffusion through plasma based etching. This is accomplished by reducing via density to prevent potential damage delivered to capacitor plates caused during the via etching and placement process.

According to an exemplary embodiment of the claimed invention, a semiconductor capacitor is disclosed comprising a top plate for collecting charge, a bottom plate for collecting an opposing charge to the top plate, a dielectric layer for insulation between the top plate and the bottom plate, a top contact, a bottom contact, a plurality of vias including top level vias for connecting the top plate to the top contact and bottom level vias for connecting the bottom plate to the bottom contact, wherein a spacing between a via and an adjacent structure is greater than a minimum via spacing requirement of a foundry design rule for a semiconductor process producing the semiconductor capacitor.

According to another exemplary embodiment of the claimed invention, a method for reducing leakage current in a semiconductor capacitor is disclosed, the method comprising providing a top plate for collecting charge, providing a bottom plate for collecting an opposing charge to the top plate, providing a dielectric layer for insulation between the top plate and the bottom plate, providing a top contact, providing a bottom contact, providing a plurality of vias including top level vias for connecting the top plate to the top contact, and bottom level vias for connecting the bottom plate to the bottom contact; and separating at least a via and an adjacent structure such that their distance is greater than a minimum via spacing requirement of a foundry design rule for a semiconductor process producing the semiconductor capacitor.

These and other objectives of the present invention will no doubt become obvious to those of ordinary skill in the art after reading the following detailed description of the preferred embodiment that is illustrated in the various figures and drawings.

DETAILED DESCRIPTION

A goal of the present invention is to reduce MIMcap leakage current by reducing the potential damage delivered to capacitor plates caused during the Via etching and placement process. In particular, it is desirable to reduce potential charge diffusion caused as a result of plasma based etching. As described in the related art, part of the Via placement process entails etching through the isolation material to reach the capacitor plate and allow for the via to make contact. Overetching will result in excess material removed from the capacitor plates, potentially causing charge diffusion and leakage current through the dielectric material.

Figure 1:
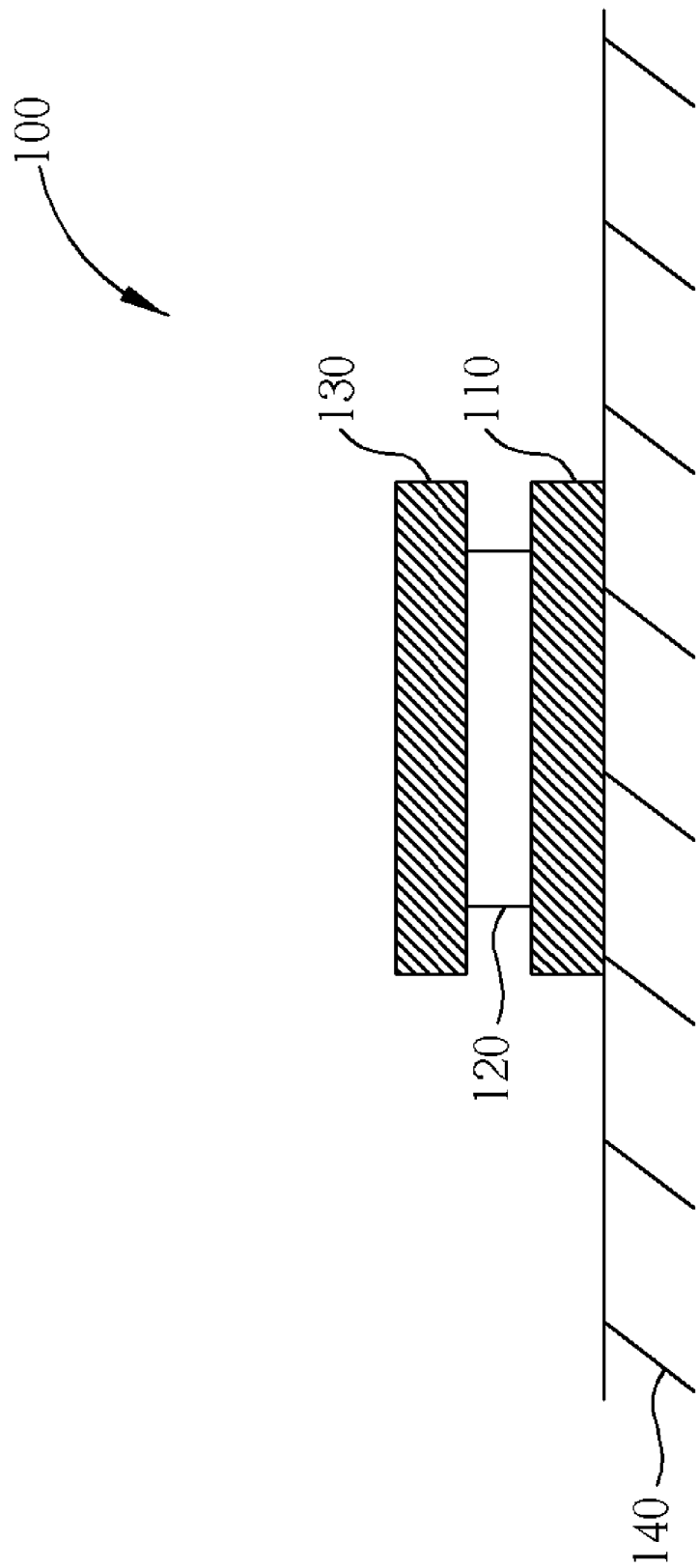
FIG. 1 shows a Metal Insulator Metal Capacitor of the related art.
Figure 2:
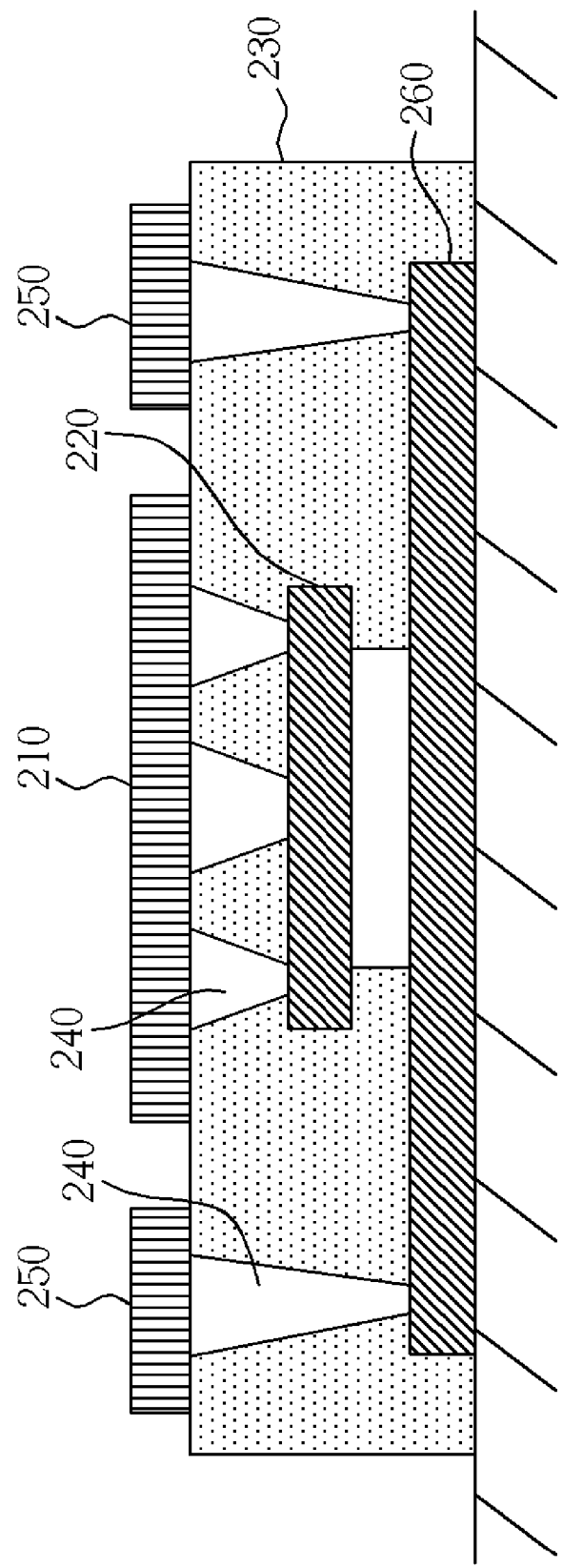
FIG. 2 shows a contact plate connection diagram of the related art.
Figure 3:
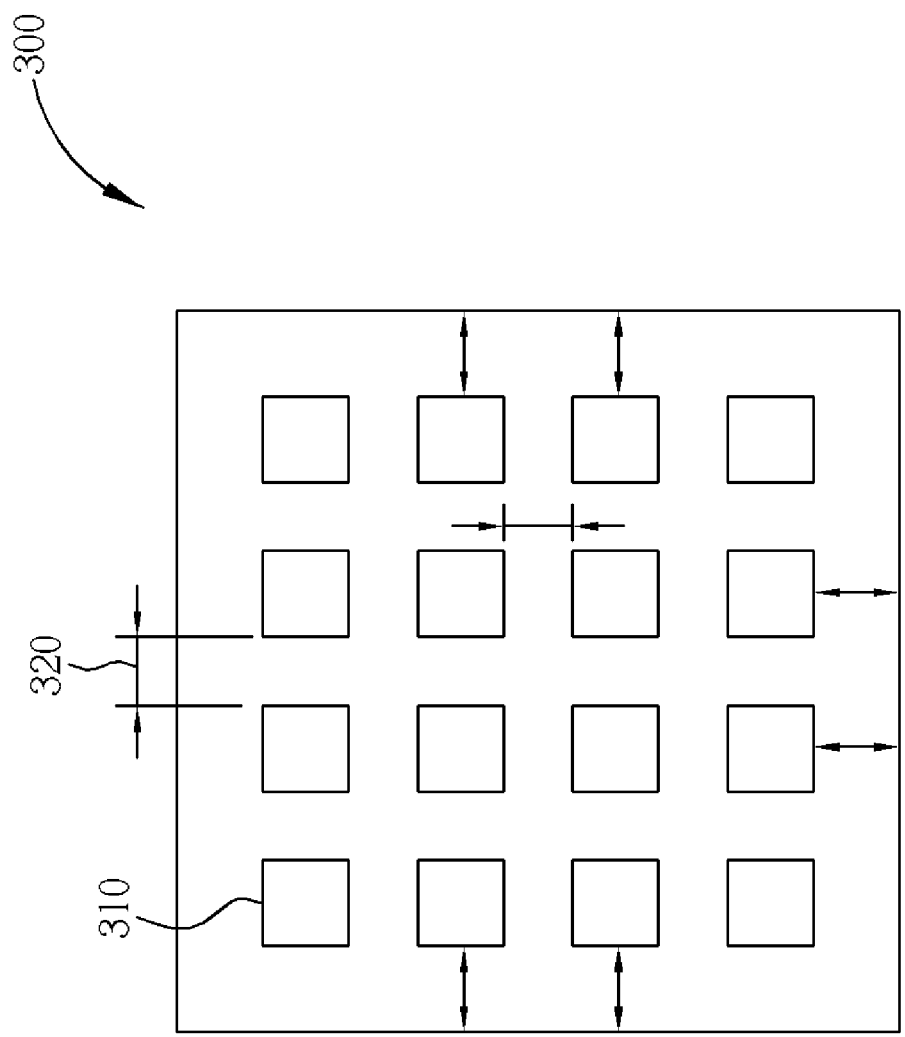
FIG. 3 shows a via die layout of the related art.

FIG. 3 shows a Via die layout 300 according to the related art. The via die layout 300 is used to pattern the via layout and configuration between the capacitor plates and the contact plates. As shown in FIG. 3, each via block 310 corresponds to a location between the capacitor plate and capacitor contact where a via is to be placed. Prior to deposition of the via contact, the area corresponding to each via block 310 must be etched down to the capacitor plate level. According to the prior art, the layout of the vias is done such that they are numerically maximized in accordance to the foundry design guidelines. These guidelines ensure that a process can be controllably performed within a minimum specification of the process parameter. For example, in a 0.18 um process, the foundry design rule states that the foundry minimum spacing $d_f$ is 0.28 um, which corresponds to the minimum dimensional feature spacing in this structure. Therefore, the foundry design rules for a 0.18 um process require that vias be at a minimum of $d_f$=0.28 um on each side, and that they are spaced at least 0.28 um apart from an adjacent via.

The placement of each via block 310 in the via die layout 300 as shown in FIG. 3 are arranged in a grid array such that the number of vias are maximized, and the minimum distances according to the foundry design rules are met. More specifically, the via spacing 320, and the spacing from the edge of the die to an adjacent via all meet the minimum dimensions of $d_f$ from the foundry design rules for a given process. Because the number of via blocks 310 are maximized in the via die layout 300, the resistance between the capacitor plate and the contact plate is minimized and current flow is maximized. However, a maximized via array may have negative implications. The deposition of each via may inadvertently damage the capacitor plate level beneath it. With an increased amount of via hole contacts, the more likely that damage to the capacitor plate will occur. Increasing the Via density may also result in overetching of the insulation layer into the metal plates. If parts of the capacitor plates are removed or damaged, leakage current may result as charges may diffuse through the plate through the dielectric.

Figure 4:
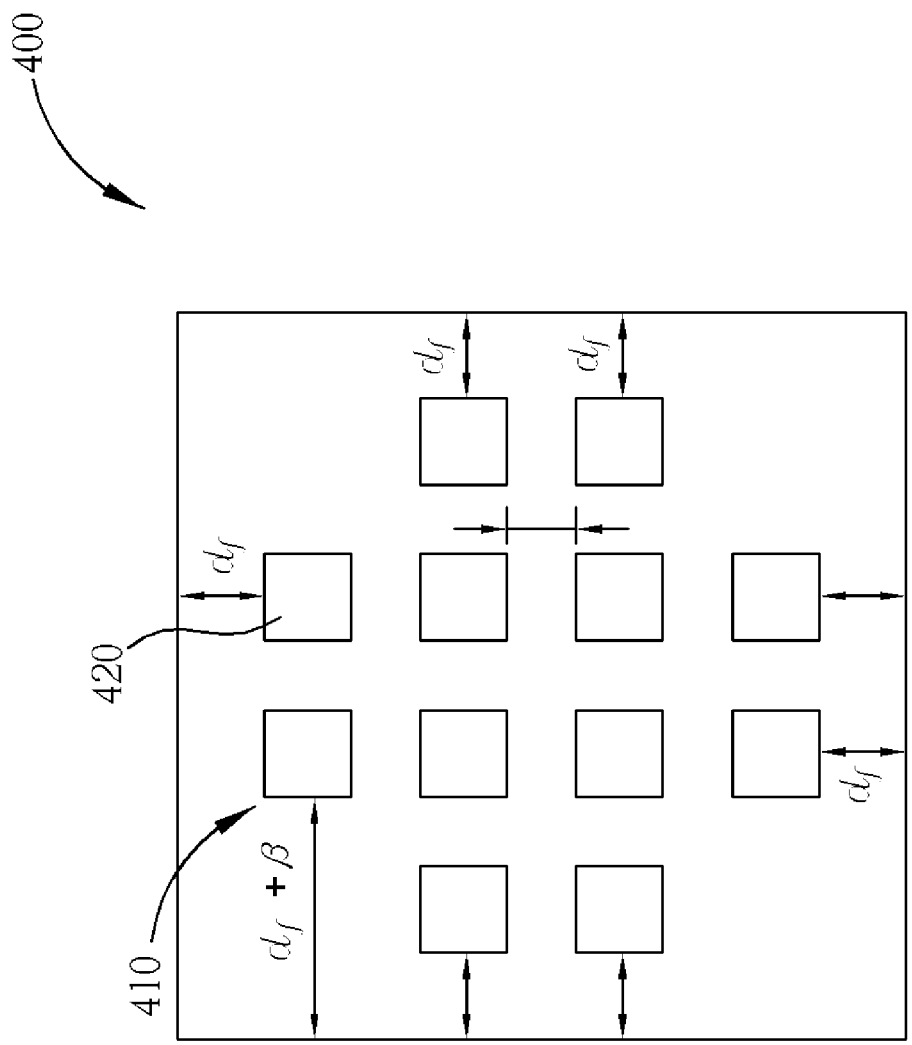
FIG. 4 shows a first exemplary embodiment of a via die layout of the present invention.

FIG. 4 shows a first embodiment of a via die array 400 of the present invention. In order to reduce the likelihood of capacitor plate damage during the via placement process, the density of vias is not fully maximized. In other words, the minimum feature distance $d_f$ stated by the foundry design principles are not fully utilized. FIG. 4 shows that die block 410 is at a distance from the adjacent structure (left edge of the die edge, which corresponds to the capacitor plate edge) at a distance of $d_f+\beta$, which is greater than the foundry minimum length $d_f$. In this manner, fewer areas of the capacitor plate are exposed during etching to reduce the probability of sustaining damage. Also, this reduces the probability of charge diffusion through the dielectric during plasma etching. The present invention thus requires that at least one via block 410 be separated from an adjacent structure at a distance exceeding the foundry minimum length.

In alternative to having the adjacent structure comprise an adjacent capacitor plate edge, the adjacent structure can be an adjacent via block to via block 410 being at a distance greater than the minimum via spacing requirement of a foundry design rule $d_f$. Having the spacing between at least one pair of adjacent vias greater than the minimum via spacing requirement of a foundry design rule $d_f$ can also satisfy the conditions of the present invention. For example, if via block 410 and via block 420 (being adjacent to via block 410) of FIG. 4 were separated at a distance greater than $d_f$, then fewer overall via blocks would be implemented to help prevent capacitor plate damage.

Ensuring that the spacing between a via and an adjacent structure is greater than a minimum via spacing requirement of a foundry design rule both equally imply that the via density is not maximized. Again, the adjacent structure can be an adjacent via to form a pair of adjacent vias, or if the via is a perimeter via, the adjacent structure can also be an adjacent capacitor plate edge forming a perimeter via and adjacent capacitor plate edge pairing. Utilization of these principles means the total number of vias on the semiconductor capacitor would be lower than the maximum allowable number according to the minimum via spacing of the foundry design principles for a particular semiconductor process. In some embodiments, it may be preferable to specifically set the spacing between the via and the adjacent structure. For example, one embodiment may have the distance being 1.5 times greater than the minimum via spacing requirement of the foundry design rule. Another embodiment may have the distance being 2 times greater. The specific spacing between the via and adjacent structure is in fact arbitrary and intermediate, so long as the distance exceeds the minimum foundry length.

Figure 5:
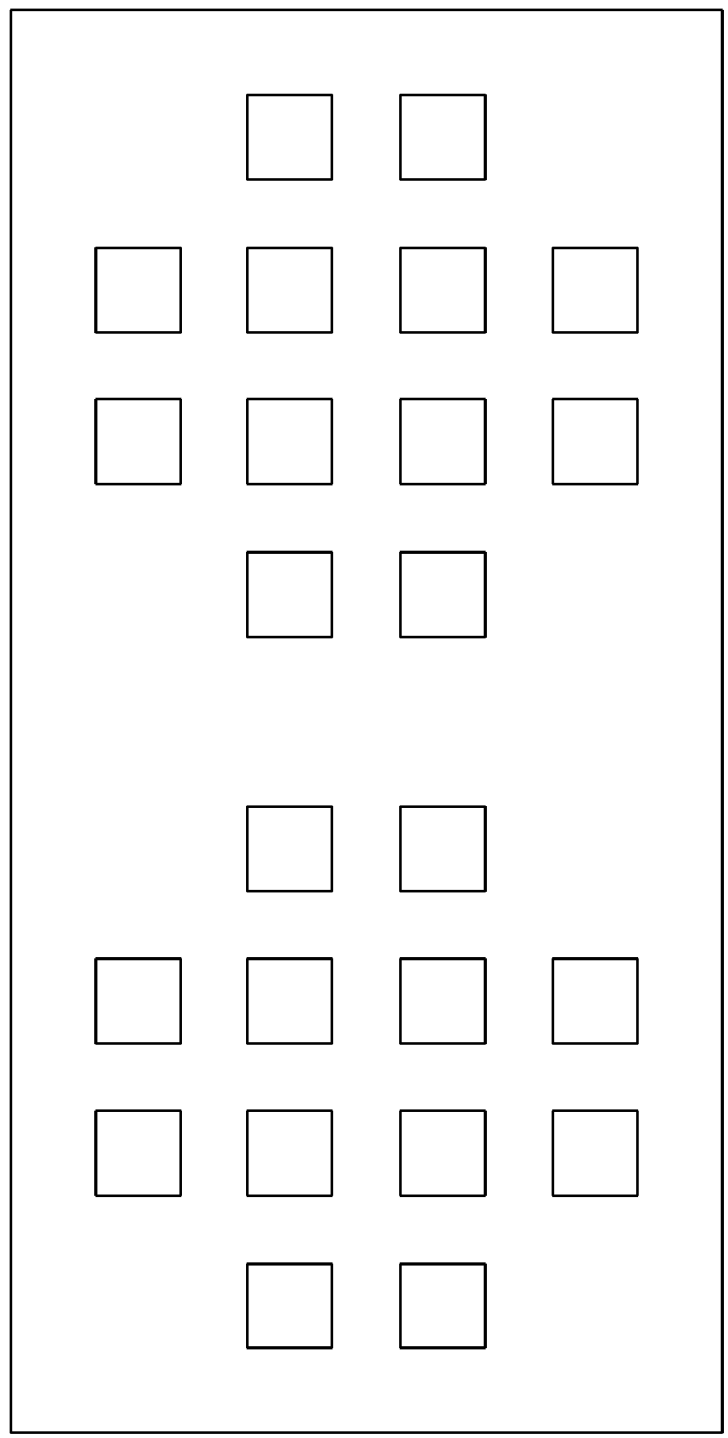
FIG. 5 shows a second exemplary embodiment of a via die layout of the present invention.

Although FIG. 4 displays a via die array 400 where the via blocks are located purely at grid points about the capacitor plates, please note that the die array need not be arranged as such in order to follow the method of the present invention. FIG. 5 shows a second embodiment of the present invention. In FIG. 5, the via die array 500 is presented in a rectangular form. Die array 500 appears similar to a pattern of two die arrays of that shown in FIG. 4. In this embodiment, the die array also meets the requirements of the minimum feature spacings being greater than the minimum distance $d_f$ recommended by the foundry principle for a given process. Thus the spacing between at least one pair of adjacent vias, or the spacing between at least one perimeter via and the nearest adjacent capacitor plate edge are greater than a minimum via spacing requirement $d_f$ of a foundry design rule for a given process to reduce the overall via density layout.

Figure 6:
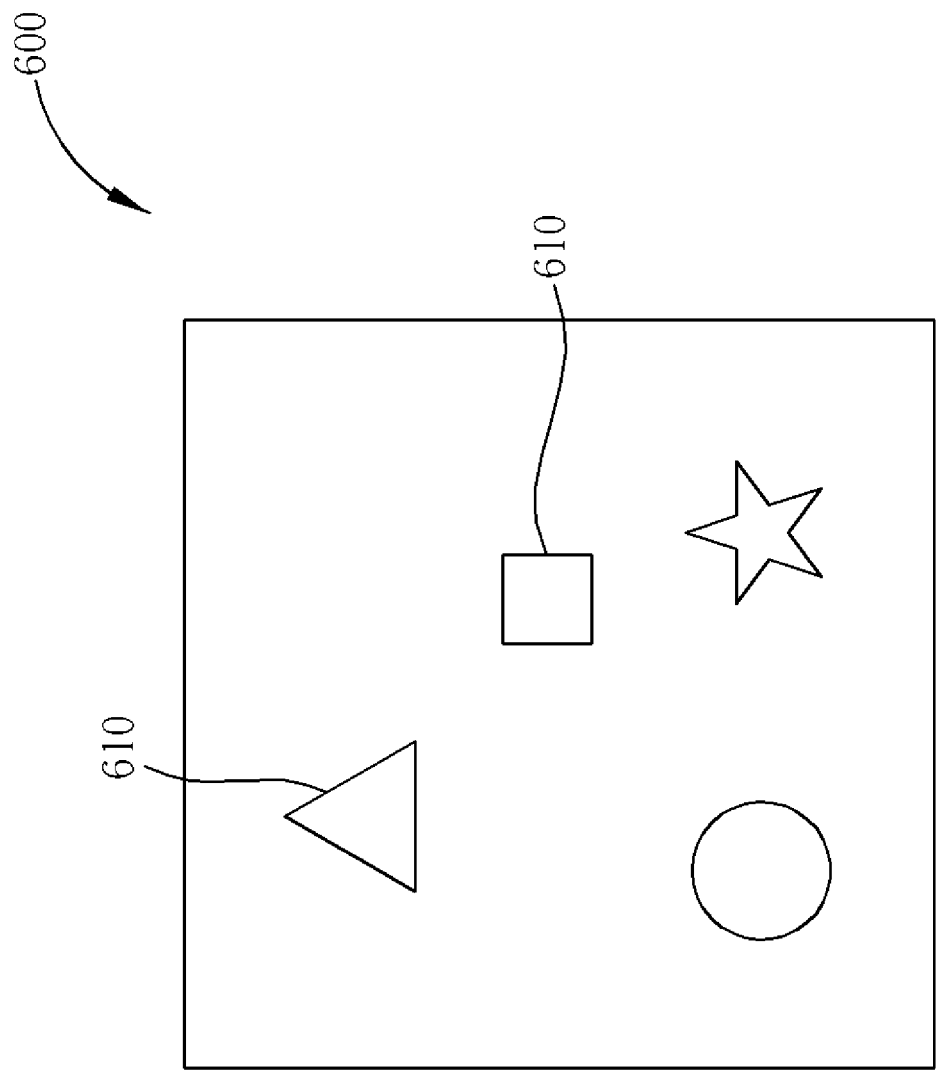
FIG. 6 shows a third exemplary embodiment of a via die layout of the present invention.

FIG. 6 shows yet another embodiment of the present invention. In the die array 600 of FIG. 6, the via die blocks 610 each possess arbitrary shapes, with at least one pair of individual via blocks being separated at a distance being greater than the minimum distance $d_f$ as given by the foundry design rules for a given process. Also, please note that the via die blocks 610 are located non symmetrically about the top plate and the bottom plate. In this manner, the via block density is not maximized, thereby reducing the potential for capacitor plate damage during the via etching and placement process.

Figure 7:
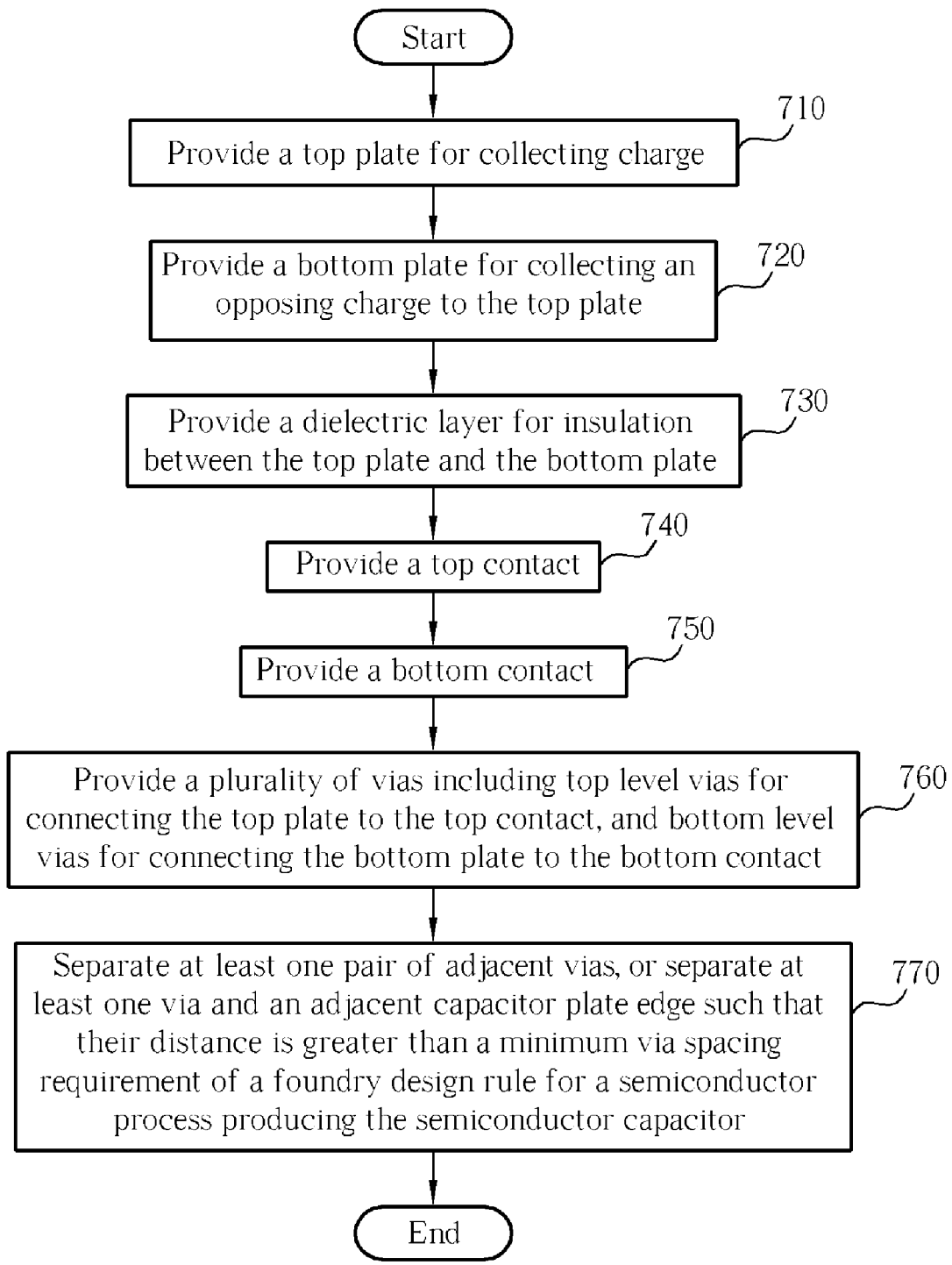
FIG. 7 shows a process flow chart describing a method of reducing leakage current in a semiconductor capacitor according to an exemplary embodiment of the present invention.

FIG. 7 displays a process flow chart 700 of a method for reducing capacitor leakage in a metal insulator metal capacitor through a reduced via density layout according to an exemplary embodiment of the present invention. Provided that substantially the same result is achieved, the steps of the process 700 need not be in the exact order shown and need not be contiguous, that is, other steps can be intermediate. This method reduces MIM capacitor leakage current by reducing the potential damage delivered to capacitor plates caused during the via etching and placement process and includes the following steps:

Step 710: provide a top plate for collecting charge

Step 720: provide a bottom plate for collecting an opposing charge to the top plate Step 730: provide a dielectric layer for insulation between the top plate and the bottom plate Step 740: provide a top contact Step 750: provide a bottom contact Step 760: provide a plurality of vias including top level vias for connecting the top plate to the top contact, and bottom level vias for connecting the bottom plate to the bottom contact Step 770: separating a via and an adjacent structure such that their distance is greater than a minimum via spacing requirement of a foundry design rule for a semiconductor process producing the semiconductor capacitor.

Because ICs are precise and accurate devices, it is important that the components which comprise them remain as such. MIM capacitors are a well known and widely used type of on-chip capacitor, which are easily integrated onto a semiconductor substrate. To ensure that MIM capacitance values and functionalities remain at acceptable standards, and that potential leakage current is minimized or eliminated, the method and device of the present invention can be utilized. By reducing the exposed area of the capacitor top plate during the via etch and placement process in accordance to the present invention, we reduce the probability of damage during the process and thereby reduce potential capacitor leakage through diffusion. A more accurate and reliable MIM capacitor, in turn results in better performing and predictable IC functionalities, which serves to benefit the end users of any such related device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor capacitor comprising:
   a top plate for collecting charge;
   a bottom plate for collecting an opposing charge to the top plate;
   a dielectric layer for insulation between the top plate and the bottom plate;
   a top contact;
   a bottom contact;
   a plurality of vias comprising top level vias for connecting the top plate to the top contact, and bottom level vias for connecting the bottom plate to the bottom contact;
   wherein a minimum spacing between vias of the top level vias is different from a minimum spacing between vias of the bottom level vias.

2. The semiconductor capacitor of claim 1 wherein a substrate material of the semiconductor capacitor is silicon.

3. The semiconductor capacitor of claim 1 wherein the dielectric layer is silicon oxide.

4. The semiconductor capacitor of claim 1 wherein an etching process for creating a via connection hole for the semiconductor capacitor comprises a plasma based etch.

5. The semiconductor capacitor of claim 1 wherein the top level vias of the semiconductor capacitor are located non symmetrically about the top plate.

6. The semiconductor capacitor of claim 1 wherein the vias of the semiconductor capacitor are located on grid points about the top plate and the bottom plate.

7. The semiconductor capacitor of claim 1 wherein the minimum spacing between vias of the top level vias is greater than the minimum spacing between vias of the bottom level vias.

8. The semiconductor capacitor of claim 1 wherein the bottom plate of the semiconductor capacitor is formed on a semiconductor substrate through conductive doping.

9. The semiconductor capacitor of claim 1 wherein the bottom plate of the semiconductor capacitor is metal, and the top plate of the semiconductor capacitor is metal.

10. The semiconductor capacitor of claim 1 wherein a number of top level vias of the semiconductor capacitor is lower than a maximum number that would be allowed according to a minimum via spacing requirement of a foundry design rule for the semiconductor process producing the semiconductor capacitor.

11. The semiconductor capacitor of claim 1 wherein the minimum spacing between one of the top level vias and an adjacent via is about 1.5 times greater than a minimum via spacing requirement of a foundry design rule for the semiconductor process producing the semiconductor capacitor.

12. The semiconductor capacitor of claim 1 wherein the minimum spacing between one of the top level vias and an adjacent via is about 2 times greater than a minimum via spacing requirement of a foundry design rule for the semiconductor process producing the semiconductor capacitor.

13. A method for reducing leakage current in a semiconductor capacitor, the method comprising:
    providing a top plate for collecting charge;
    providing a bottom plate for collecting an opposing charge to the top plate;
    providing a dielectric layer for insulation between the top plate and the bottom plate;
    providing a top contact;
    providing a bottom contact; and
    providing a plurality of vias comprising top level vias for connecting the top plate to the top contact, and bottom level vias for connecting the bottom plate to the bottom contact;
    wherein a minimum spacing between vias of the top level vias is different from a minimum spacing between vias of the bottom level vias.

14. The method of claim 13 wherein a substrate material of the semiconductor capacitor is silicon.

15. The method of claim 13 wherein the dielectric layer is silicon oxide.

16. The method of claim 13 further comprising utilizing a plasma based etch for creating a via connection hole for the semiconductor capacitor.

17. The method of claim 13 further comprising separating the top level vias of the semiconductor capacitor non symmetrically about the top plate.

18. The method of claim 13 further comprising separating the vias of the semiconductor capacitor on grid points about the top plate and the bottom plate.

19. The method of claim 13 wherein the minimum spacing between vias of the top level vias is greater than the minimum spacing between vias of the bottom level vias.

20. The method of claim 13 further comprising conductively doping a semiconductor substrate to form the bottom plate of the semiconductor capacitor.

21. The method of claim 13 wherein the bottom plate of the semiconductor capacitor is metal, and the top plate of the semiconductor capacitor is metal.

22. The method of claim 13 wherein a number of top level vias in the semiconductor capacitor is lower than a maximum number that would be allowed according to a minimum via spacing requirement of a foundry design rule for the semiconductor process producing the semiconductor capacitor.

23. The method of claim 13 further comprising separating one of the top level vias and an adjacent via such that their distance is about 1.5 times greater than a minimum via spacing requirement of a foundry design rule for the semiconductor process producing the semiconductor capacitor.

24. The method of claim 13 further comprising separating one of the top level vias and an adjacent via such that their distance is about 2 times greater than a minimum via spacing requirement of a foundry design rule for the semiconductor process producing the semiconductor capacitor.

25. A semiconductor capacitor comprising:
    a top plate;
    a bottom plate;
    a dielectric layer for insulation between the top plate and the bottom plate;
    a top contact;
    a bottom contact;
    a plurality of top level vias for connecting the top plate to the top contact, and
    a plurality of bottom level vias for connecting the bottom plate to the bottom contact;
    wherein a layout density of the top level vias is different from a layout density of the bottom level vias.

26. The semiconductor capacitor of claim 25 wherein the top level vias are formed in via holes, and the via holes are formed by plasma based etching process.

27. The semiconductor capacitor of claim 25 wherein the layout density of the top level vias is smaller than the layout density of the bottom level vias.

28. A method for reducing leakage current in a semiconductor capacitor, the method comprising:
    providing a top plate;
    providing a bottom plate;
    providing a dielectric layer for insulation between the top plate and the bottom plate;
    providing a top contact;
    providing a bottom contact; and
    providing a plurality of top level vias for connecting the top plate to the top contact, and a plurality of bottom level vias for connecting the bottom plate to the bottom contact;
    wherein a layout density of the top level vias is different from a layout density of the bottom level vias.

29. The method of claim 28 wherein the top level vias are formed in via holes, and the via holes are formed by plasma based etching process.

30. The method of claim 28 wherein the layout density of the top level vias is less than the layout density of the bottom level vias.

* * * * *